United States Patent
Nagarajan et al.

[11] Patent Number: 5,965,840
[45] Date of Patent: Oct. 12, 1999

[54] MAGNETORESISTIVE SENSOR FOR MAGNETIC STORAGE SYSTEM

[75] Inventors: Subra Nagarajan, Burnsville; Ramesh Sundaram, Eden Prairie; Mary Cynthia Hipwell, Minneapolis; Clifton H. K. Chang, Bloomington, all of Minn.

[73] Assignee: Seagate Technology, Inc., Scotts Valley, Calif.

[21] Appl. No.: 08/864,153

[22] Filed: May 28, 1997

[51] Int. Cl.[6] ................................................ H01L 35/28
[52] U.S. Cl. ..................... 136/203; 136/204; 360/113; 338/32 R; 324/207.21; 324/252
[58] Field of Search .................... 324/207.21, 252; 338/32 R; 360/113, 104; 136/203, 204

[56] References Cited

U.S. PATENT DOCUMENTS

| | | | |
|---|---|---|---|
| 4,351,005 | 9/1982 | Imai et al. | 358/300 |
| 4,405,961 | 9/1983 | Chow et al. | 360/129 |
| 4,685,081 | 8/1987 | Richman | 365/1 |
| 4,803,580 | 2/1989 | Mowry | 360/113 |
| 5,006,864 | 4/1991 | Ayata et al. | 346/33 |
| 5,227,721 | 7/1993 | Kataoka et al. | 324/248 |
| 5,228,923 | 7/1993 | Hed | 136/208 |
| 5,229,327 | 7/1993 | Farnworth | 437/209 |
| 5,265,113 | 11/1993 | Halldörsson et al. | 372/36 |
| 5,414,591 | 5/1995 | Kimura et al. | 361/695 |
| 5,418,775 | 5/1995 | Okatani | 369/275.5 |
| 5,463,518 | 10/1995 | Otomo et al. | 505/171 |
| 5,486,728 | 1/1996 | Hirama | 310/40 |
| 5,493,457 | 2/1996 | Kawamura et al. | 369/75.1 |
| 5,522,215 | 6/1996 | Matsunaga et al. | 62/32 |
| 5,759,418 | 6/1998 | Frater et al. | 216/22 |

*Primary Examiner*—Kathryn Gorgos
*Assistant Examiner*—Wesley A. Nicholas
*Attorney, Agent, or Firm*—Westman, Champlin & Kelly, P.A.

[57] ABSTRACT

A magnetoresistive sensor in the magnetic storage device includes a magnetoresistive element for sensing magnetic fields carried on storage medium. A cooling device is thermally coupled to the magnetoresistive element and arranged to conduct heat in a direction away from the magnetoresistive element to thereby cool the magnetoresistive element during normal operation of the storage device.

20 Claims, 3 Drawing Sheets

MAGNETORESISTIVE SENSOR FOR MAGNETIC STORAGE SYSTEM

BACKGROUND OF THE INVENTION

The present invention relates to magnetic storage systems. More specifically, the present invention relates to magnetoresistive sensors used in magnetic storage systems to read back stored information.

Magnetic storage systems are used to store information in a magnetic format for subsequent retrieval. Various technologies are available for reading back the stored information. One promising technology is the use of a magnetoresistive sensor for such read back.

Magnetoresistive sensors are responsive to a change in resistivity caused by the presence of magnetic fields and are increasingly being employed as read back elements in the heads of magnetic disc drives. They are particularly advantageous because the change in resistivity is independent of disc speed and depends only on the magnetic flux. Further, the sensor output is easily scaled by adjusting the sense current.

Magnetoresistive sensors typically comprise a thin strip of ferromagnetic material such as NiFe magnetized along an easy axis of low coercivity. The strip is mounted in the head such that the easy axis is transverse to the direction of disc rotation and parallel to the plane of the disc. Magnetic flux from the disc surface causes rotation of the magnetization vector of the stip, which in turn causes a change in electrical resistivity. A sense current is passed through the thin strip and the magnetic flux can be detected by measuring the change in voltage across the element as a result of the changing resistivity.

One drawback with magnetoresistive sensors is that the resistance of the magnetoresistive element and its sensitivity vary with temperature. Magnetoresistive sensor parametrics have been measured to degrade at ambient temperatures as low as 65° C. However, during operation of the magnetoresistive sensor, its temperature tends to rise due, to for example, current flowing through the sense element, and the general increase in the ambient temperature from other components in the disc drive system such as the spindle motor, actuator and control circuitry. Common operating temperatures are as high as 60° C. during normal operation, or even higher during intense operation. Further, the ambient temperature for high end components is being pushed higher as higher speeds, increased seek rates, and higher density components are designed. The prior art has focused on making the magnetoresistive sensor element less heat sensitive and/or attempting to compensate for this temperature dependency.

SUMMARY OF THE INVENTION

The present invention relates to a magnetoresistive head in a magnetic storage device which includes a cooling device thermally coupled to a magnetoresistive element. In one embodiment, the cooling device is arranged such that heat is conducted away from the magnetoresistive element. The magnetoresistive head includes a substrate which carries the magnetoresistive element. Sensor conductors are coupled to the magnetoresistive element and are used for providing an electrical output related to magnetic flux emanating from a storage medium such as a disc. In one preferred embodiment, the cooling device is a Peltier cooling element. Electrical contacts are provided to the Peltier element such that a current may be passed through the Peltier element to cause heat to be transferred in a direction away from the magnetoresistive element. A heat sink may be provided and arranged to receive the heat which is conducted away from the magnetoresistive element.

In another aspect of the invention, a thermal element is used to selectively heat or cool the magnetoresistive head. This can be used to selectively physically deform the head to counteract other undesirable deformations or to adjust head/disc spacing. Yet another aspect of the invention includes heating the head when performing thermal asperity mapping of the disc.

DETAILED DESCRIPTION OF THE PREFERRED EMBODIMENTS

The present invention includes a magnetoresistive head for use in a magnetic storage device. The magnetoresistive head includes a magnetoresistive element and a cooling device which is thermally coupled to the magnetoresistive element. Thus, one aspect of the present invention is the recognition that a cooling device may be thermally coupled to a magnetoresistive element whereby undesirable heat is conducted away from the element. Thus, the temperature sensitivity of the magnetoresistive element is less critical than in prior art designs. Further, additional thermal compensation is not required, or the system need only compensate for smaller thermal variations than in prior art designs.

Figure 1:
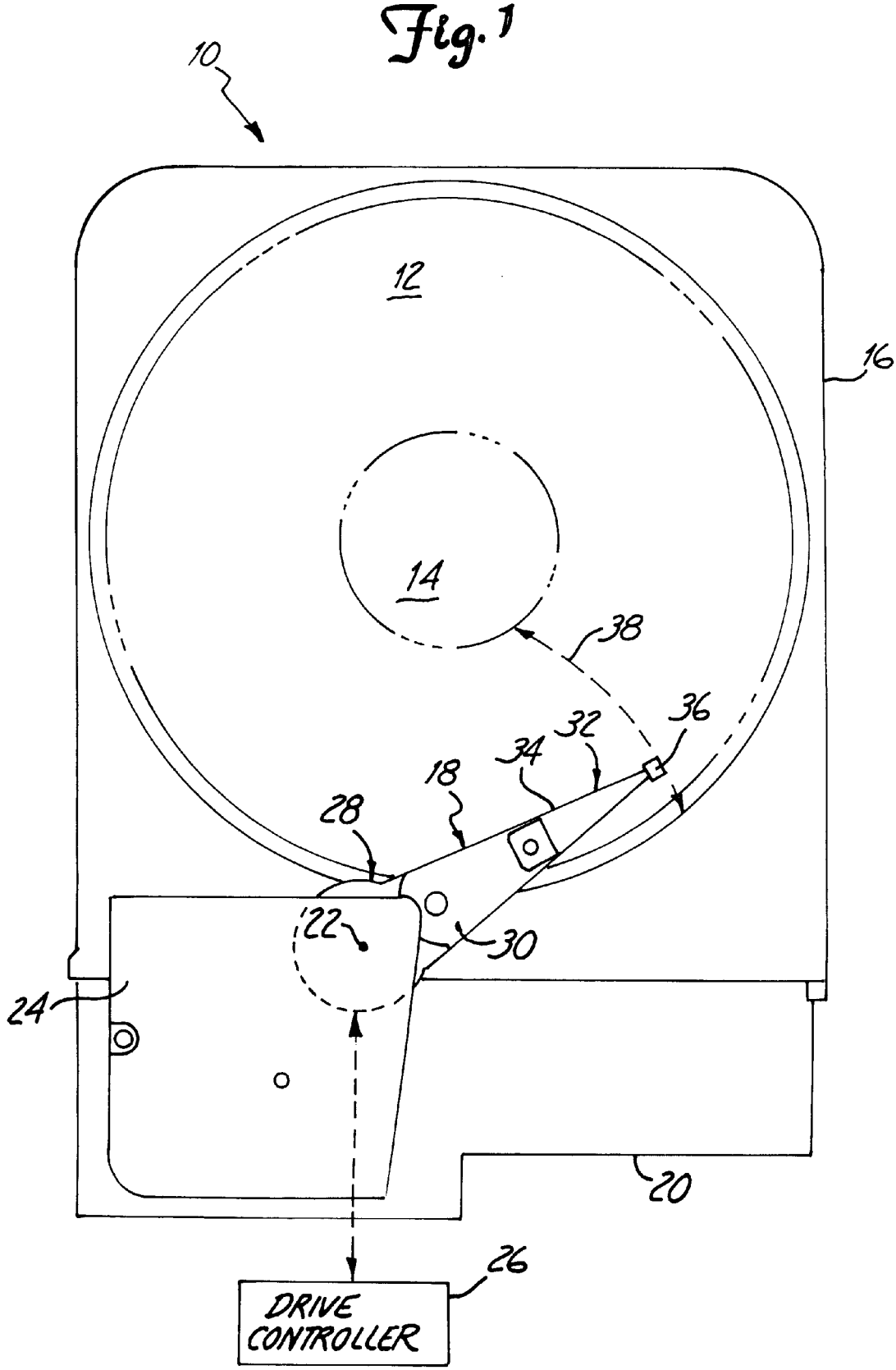
FIG. 1 is a simplified diagram of a disc drive storage system.

FIG. 1 is a top view of a disc drive 10 including a magnetoresistive sensor in accordance with the present invention. Disc drive 10 includes a magnetic disc 12 mounted for rotational movement about an axis defined by spindle 14 Within housing 16. Disc drive 10 also includes an actuator 18 mounted to a base plate 20 of housing 16 and pivotally moveable relative to disc 14 about axis 22. A cover 24 covers a portion of actuator 18. Drive controller 26 is coupled to actuator 18. In the preferred embodiment, drive controller 26 is either mountable within disc drive 10, or is located outside of disc drive 10 with suitable connection to actuator 18. Actuator 18, includes an actuator arm assembly 28, a rigid support member 30, and a head gimbal assembly 32. Head gimbal assembly 32 includes a load beam 34 coupled to rigid member 30, and a hydrodynamic air bearing (a slider) coupled by a gimbal (not shown) to load beam 34. Slider 36 supports a transducer for reading information from disc 12 and encoding information on disc 12.

During operation, drive controller 26 receives position information indicating a portion of disc 12 to be accessed. Drive controller 26 receives the position information from an operator, from a host computer, or from another suitable controller. Based on the position information, drive controller 26 provides a position signal to actuator 18. The position signal causes actuator 18 to pivot about axis 22. This, in turn, causes actuator 18 to pivot about axis 22. This, in turn, causes slider 36 (and consequently the transducer mounted on slider 36) to move radially over the surface of disc 12 in a generally arcuaic path indicated by arrow 38. Drive controller 26 and actuator 18 operate in a known closed loop, negative feedback manner so that the transducer carried by slider 36 is positioned over the desired portion of disc 12. Once the transducer is appropriately positioned, drive controller 26 then executes a desired read or write operation.

Figure 2:
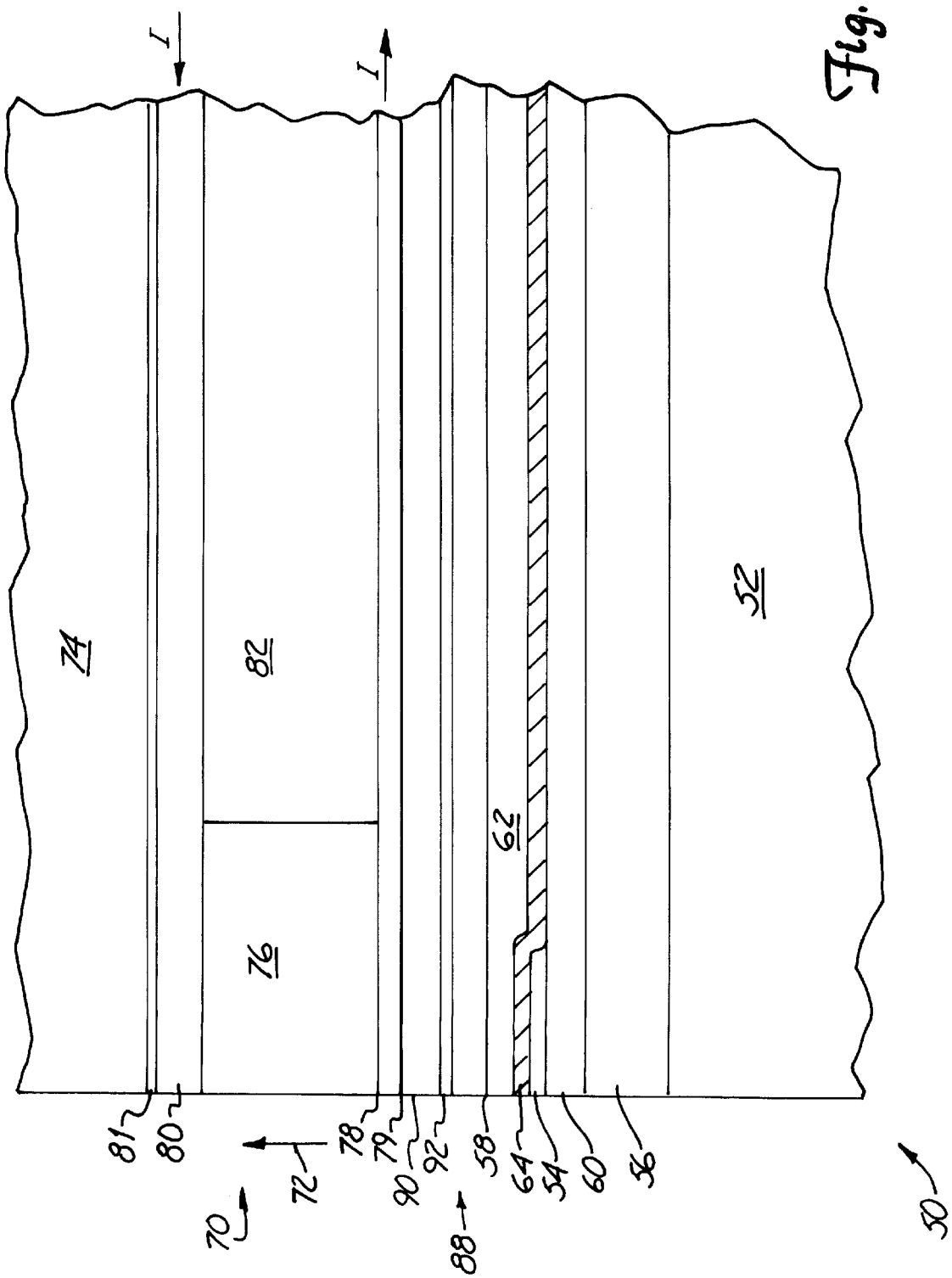
FIG. 2 is a cross-sectional view of a magnetoresistive sensor for use in the storage system of FIG. 1 in accordance with one preferred embodiment of the present invention.

FIG. 2 is a simplified cross-sectional view of a magnetoresistive sensor 50 in accordance with one preferred embodiment of the present invention. Magnetoresistive sensor 50 is mounted on slider 36 for reading information from disc 12. Typically, a magnetic write element (not shown) is also mounted on slider 36 for writing information on to disc 12. Magnetoresistive sensor 50 includes a substrate 52 which carries a magnetoresistive element 54. Magnetic shields 56 and 58 are positioned on opposing side of magnetoresistive element 54 to shield magnetoresistive element from stray magnetic fields. Insulating layers 60 and 62 are positioned between magnetoresistive element 54 and shields 56 and 58, respectively. A metal contact 64 is provided for making electrical contact with magnetoresistive elements 54.

In accordance with the present invention, a cooling device 70 is provided and is thermally coupled to magnetoresistive element 54. FIG. 2 shows one particular configuration and position of cooling device 70 and is merely one example. Cooling device 70 is positioned proximate to shield 58 to provide good thermal coupling to magnetoresistive element 54. Thermally conductive and electrically insulating layers 79 and 81 are also provided so that the current I does not enter the sensor or the heat sink. Preferably, device 70 conducts heat in a direction indicated by arrow 72 away from magnetoresistive element 54 and toward a heat sink 74. As used herein, "cooling device" refers to any device which promotes heat transfer wherein heat is transferred at a rate which is faster then normal thermal transfer rates. In the preferred embodiment, the cooling device 70 includes a Peltier element 76 which is electrically coupled to metal conductors 78 and 80. Conductors 78 and 80 are separated by electrical insulator 82. FIG. 2 also shows an inductive write element 88 which may optionally be included with magnetoresistive sensor 70. Write element 88 is formed between pole 90 and shield 58 (which acts as a pole) which are separated by gap material 92. A magnetic field may be produced between pole 90 and shield 58 for writing information.

In operation, a current I is passed through Peltier element 76 using conductors 78 and 80. As shown in FIG. 2, current I, is passed in a direction whereby current flows through the Peltie element 76 toward or away from the magnetoresistive element 64 for n or p-type materials, respectively. (Peltier element in FIG. 2 is n-type. Either can be used in the design. Current direction is reversed for p-type.) In accordance with the known physical properties of Peltier elements, heat is conducted in the direction shown by arrow 72. In one embodiment, conductors 78 and 80 are coupled to drive controller 26 shown in FIG. 1 whereby the rate of heat transfer may be controlled by controller 26.

The rate of heat transfer may be controlled as desired. For example, during normal operation the heat generated in the magnetoresistiie element 54 is given by:

$$\text{Heat}_{MRE} = i^2 R \qquad \text{Eq. 1}$$

Where i is the sense current and R is the nominal resistance of magnetoresistive element 54. For example, when the sense current is 13 mA and the nominal resistance of magnetoresistive element 54 is 25 Ω, the heat generated is 4 mW.

Regarding operation of Peltier device 76, the heat which is transferred out of the device is given by:

$$\Delta J_{Q1} = (\Pi_M - \Pi_S)I \qquad \text{Eq. 2}$$

and the heat transferred into the device is given by:

$$\Delta J_{Q2} = (\Pi_S - \Pi_M)I \qquad \text{Eq. 3}$$

where I is the current through the device and $\Pi_S$ and $\Pi_M$ are the Peltier constants for element 76 and contacts 78 and 80, respectively. For example, at 300 K, $\Pi_M$ for a typical metal is minus 360 and $\Pi_S$ for P-type Germanium is 1800. In this example, a heat transfer of 7 mW can be achieved when the current I is 3 mA. A typical Peltier element may have an efficiency of approximately 50 percent. Thus, in order to transfer 7 mW of heat, an additional 14 mW is required which results in a total of 21 mW being transferred to heat sink 74.

Heat sink 74 may be fabricated as desired. In one preferred embodiment, heat sink 74 comprises a copper plate which is 5 μm, 60 μm wide and 10 μm high. Heat sink 74 should be selected of material and with dimensions to have capability to sufficiently dissipate the heat transferred from magnetoresistive element 54.

Figure 3:
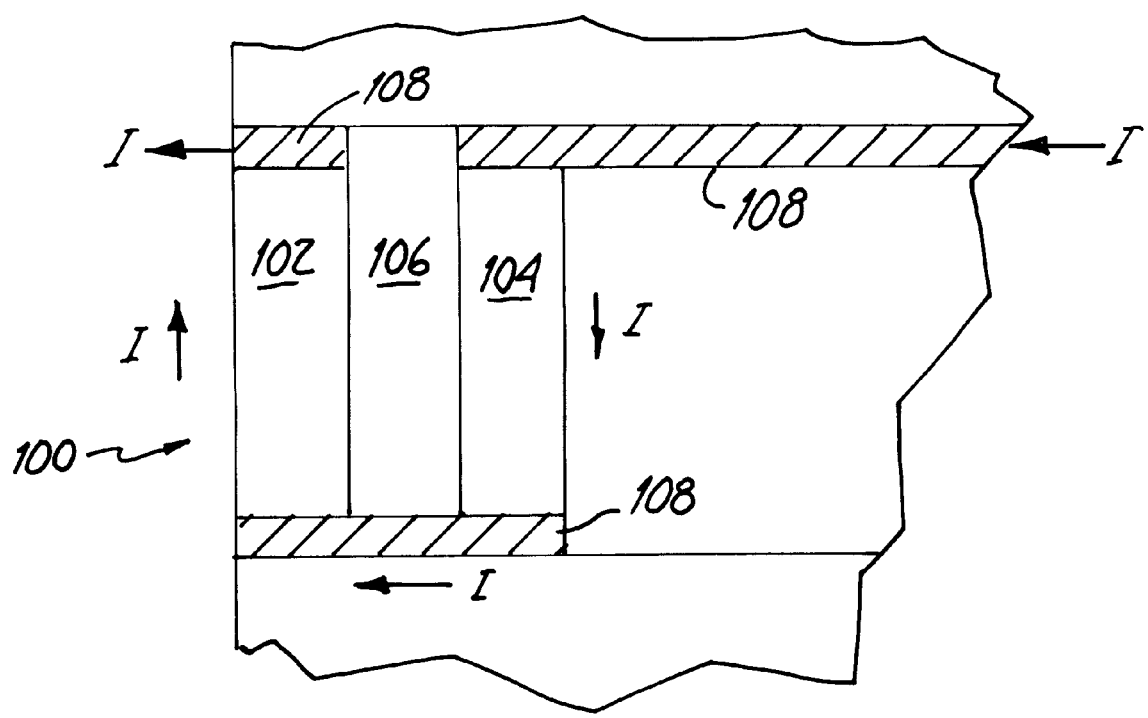
FIG. 3 is a simplified cross-sectional view of a cooling element in accordance with another embodiment of the invention.

FIG. 3 is a simplified cross-sectional view of a cooling element 100 in accordance with another embodiment. Element 100 includes p-type material 102 and an n-type material 104 separated by an insulator 106. Electrical conductors 108 are positioned to pass a current I through materials 102 and 104 in the direction shown by the arrows in the Figure. In this embodiment, the heat transfer through the p-type material 102 and the n-type material 104 will be in the same direction such that overall heat transfer is accelerated. Note that additional n-type or p-type materials may be added as desired.

The present invention is not limited to heat transfer into the magnetoresistive element or into a particular area of a head. The present invention includes selective heat transfer into selected areas of a sensor in a magnetic storage system. For example, heat can be selectively transferred to/from areas to cause selective deformation of the head/slider. For example, the heat transfer can be controlled to selectively control pole tip recession. It is known that as the temperature distribution across a pole tip changes, the dimensions of the pole tip change which may cause certain portions of the pole tip to become undesirably close to the disc surface. Using the present invention, the pole tip geometry can be thermally controlled to counteract undesirable deformation.

Another aspect of the invention includes using the inventive thermal transfer tecniques during thermal asperity mapping. Thermal asperity mapping is used during device fabrication in which asperities on the surface of the disc are mapped so that they may be selectively blocked from use during normal operation. Presently, this mapping is achieved by heating the entire disc system to cause the various parts to deform. With the present invention, the heating may be exasperated at the head by transferring heat into the head.

Although the present invention has been described with reference to preferred embodiments, workers skilled in the art will recognize that changes may be made in form and detail without departing from the spirit and scope of the invention. The particular cooling device may be selected as desired and is not limited to the Peltier device described herein. Further, the particular orientation and configuration of the device may also be selected as appropriate. Additional Peltier elements and transfer layers may be added to provide additional cooling. Further, if a temperature sensor is provided proximate the magnetoresistive element, the drive controller can selectively control the cooling device to more accurately control the temperature of the magnetoresistive element. In one embodiment, the temperature of the magnetoresistive element is maintained at less than about 60° C.

What is claimed is:

1. A magnetoresistive sensor for use with a magnetic disc storage device, comprising:

a substrate;

an integral magnetoresistive element laminated in the magnetoresistive sensor and carried on the substrate, the magnetoresistive element adapted to receive a sense current i therethrough causing $i^2R$ heating of the magnetoresistive element, where R is the nominal resistance of the magnetoresistive element;

sensor conductors coupled to the magnetoresistive element for providing an electrical output related to magnetic flux emanating from the magnetic disc; and an integral cooling element laminated in the magnetoresistive sensor, the cooling element being thermally coupled to the magnetoresistive element and arranged to conduct heat away from the magnetoresistive element.

2. The magnetoresistive sensor of claim 1 wherein the cooling element includes a Peltier element.

3. The magnetoresistive sensor of claim 2 including electrical conductors coupled to the Peltier element to conduct a current I therethrough.

4. The magnetoresistive sensor of claim 3 wherein the current I flows through the Peltier element in a direction generally toward the magnetoresistive element.

5. The magnetoresistive sensor assembly of claim 3 wherein the current I flows through the Peltier element in a direction generally away from the magnetoresistive element.

6. The magnetoresistive sensor of claim 2 wherein the Peltier element comprises Germanium.

7. The magnetoresistive sensor of claim 2 wherein the Peltier element is n-type.

8. The magnetoresistive sensor of claim 2 wherein the Peltier element is p-type.

9. The magnetoresistive sensor of claim 2 wherein the Peltier element comprises a plurality of n-type materials and p-type materials operably coupled together for heat transfer in response to an applied current.

10. The magnetoresistive sensor of claim 1 including a heat sink thermally coupled to the cooling element.

11. The magnetoresistive sensor of claim 10 wherein the cooling element is positioned between the heat sink and the magnetoresistive element.

12. The magnetoresistive sensor of claim 1 including a write element positioned between the magnetoresistive element and the cooling element.

13. The magnetoresistive sensor of claim 1 including a magnetic shield positioned between the cooling element and the magnetoresistive element to magnetically shield the magnetoresistive element and the magnetic shield of material to allow heat transfer therethrough.

14. The magnetoresistive sensor of claim 1 wherein the temperature of the magnetoresistive element is maintained at less then 60° C. during normal operation by the cooling element.

15. A magnetic disc drive system comprising:

a magnetic disc adapted to store data;

an actuator arm suitable for positioning relative to a surface of the magnetic disc;

a load beam coupled to the actuator arm;

a gimbal coupled to the load beam;

a hydrodynamic slider adapted to fly over the disc surface and coupled to the gimbal;

an integral, laminated magnetoresistive sensor adapted to read data from the magnetic disc and supported by the slider, the magnetoresistive sensor comprising:

a substrate;

a magnetoresistive element carried on the substrate and adapted to receive a sense current i therethrough causing $i^2R$ heating of the magnetoresistive element, where R is the nominal resistance of the magnetoresistive element;

sensor conductors coupled to the magnetoresistive element for providing an electrical output related to magnetic flux emanating from the magnetic disc; and an integral cooling element laminated in the magnetoresistive sensor, the cooling element being thermally coupled to the magnetoresistive element and arranged to conduct heat away from the magnetoresistive element.

16. The magnetic disc drive system of claim 15 including a heat sink thermally coupled to the cooling element.

17. The magnetic disc drive system of claim 15 wherein the cooling element includes a Peltier element.

18. The magnetic disc drive system of claim 16 including electrical conductors coupled to the Peltier element to conduct a current I therethrough.

19. The magnetic disc drive system of claim 15 including a write element positioned between the magnetoresistive element and the cooling element.

20. The magnetic disc drive system of claim 15 including a magnetic shield positioned between the cooling element and the magnetoresistive element to magnetically shield the magnetoresistive element and the magnetic shield of material to allow heat transfer therethrough.

* * * * *